United States Patent [19]
Choi et al.

[11] Patent Number: 5,422,295
[45] Date of Patent: Jun. 6, 1995

[54] METHOD FOR FORMING A SEMICONDUCTOR MEMORY DEVICE HAVING A VERTICAL MULTI-LAYERED STORAGE ELECTRODE

[75] Inventors: Young-jae Choi, Yongin-kun; Tae-young Chung, Suwon; Jong-woo Park, Seoul; Young-pil Kim, Suwon, all of Rep. of Korea

[73] Assignee: Samsung Electronics Co., Ltd., Suwon, Rep. of Korea

[21] Appl. No.: 164,671

[22] Filed: Dec. 10, 1993

[30] Foreign Application Priority Data

Dec. 10, 1992 [KR] Rep. of Korea ............ 92-23802
Mar. 24, 1993 [KR] Rep. of Korea ............ 93-4636

[51] Int. Cl.6 .................... H01L 21/70; H01L 27/00
[52] U.S. Cl. ........................... 437/52; 437/60; 437/919
[58] Field of Search ............ 437/52, 60, 919, 947, 437/981, 47; 257/306

[56] References Cited

U.S. PATENT DOCUMENTS

| | | | |
|---|---|---|---|
| 5,071,783 | 12/1991 | Taguchi et al. | 437/52 |
| 5,128,273 | 7/1992 | Ema | 437/52 |
| 5,164,337 | 11/1992 | Ogawa et al. | 437/52 |

*Primary Examiner*—Olik Chaudhuri
*Assistant Examiner*—H. Jey Tsai
*Attorney, Agent, or Firm*—Charles R. Donohoe; Robert A. Westerlund, Jr.; Stephen R. Whitt

[57] ABSTRACT

A manufacturing method for a semiconductor memory device including a capacitor having a double fin-shaped structure is provided, wherein a storage electrode is formed by applying a thick planar material capable of being wet-etched between the double fins consisting of conductive layers. The storage electrode is formed by forming a thin, high temperature oxide film having an etching rate which is great. Thus, the resulting memory cell's topography is improved and damage to the storage electrode is decreased.

15 Claims, 10 Drawing Sheets

METHOD FOR FORMING A SEMICONDUCTOR MEMORY DEVICE HAVING A VERTICAL MULTI-LAYERED STORAGE ELECTRODE

FIELD OF THE INVENTION

The present invention relates to a manufacturing method for a semiconductor memory device. More particularly, it relates to a manufacturing method for a dynamic random access memory (DRAM) device having a greatly increased cell capacitance and enhanced reliability.

BACKGROUND OF THE INVENTION

DRAM memory devices are comprised of individual memory cells. The surface area of each of the individual memory cells necessarily decrease as the DRAM device becomes more integrated. Each memory cell of a DRAM device contains a charge-storage capacitor for storing the memory information. As the size of the memory cell decreases, the effective area of the charge-storage capacitor in each memory cell decreases, which results in a decreased capacitance of the charge-storage capacitor. This decrease of charge-storage capacitance inevitably results in an increase of soft errors caused by the increased inflow of noise charges generated by alpha particles. Therefore, the higher integration of DRAM devices has necessitated a decreased cell size without a decrease in the charge-storage capacitance. Therefore, the effective area of a capacitor must be expanded in a decreased memory cell.

In order to satisfy, this requirement, a stack capacitor (STC) memory cell structure has been under development since the late 1970's. The general structure of the STC memory cell is as follows. AMOS transistor is formed within an active region of a semiconductor substrate, and a capacitor is connected through a buried contact to a source region of the MOS transistor. The storage electrode of the capacitor is horizontally extended to the upper part of the transistor's gate electrode and centered on the buried contact, thereby forming a memory cell having a stacked capacitor structure. This structure can increase the effective area of a capacitor formed between the above storage electrode and a plate electrode formed to correspond to the storage electrode.

A conventional STC memory cell is manufactured as follows. First, a MOS transistor is formed in the active region of a semiconductor substrate. A high temperature oxide (HTO) film is then formed to insulate the gate electrode of the MOS transistor, and a buried contact is formed over the source region of the MOS transistor. Thereafter, polysilicon is deposited for forming a storage electrode, which is then patterned by a conventional photolithography process, thus forming the storage electrode of the capacitor. After that, a dielectric film and plate electrode are formed to correspond to the above storage electrode, and a bit line is formed to complete the STC memory cell.

However, the conventional manufacturing method of the STC memory cell has the disadvantage of a reduced absolute effective area of the storage electrode in accordance with the decreasing cell size due to the higher integration of semiconductor memory devices. Therefore, the above STC memory cell structure is not suitable in manufacturing a DRAM device whose integration is beyond a real limit, e.g., 16 Mb.

Another conventional method of manufacturing an increased capacitance in a memory cell uses a high dielectric film, i.e., tantalum oxide ($Ta_2O_5$). However, when tantalum oxide is used, leakage current is increased as compared with the use of silicon oxide or silicon nitride.

Another conventional method of increasing the memory cell capacitance is the use of a trench capacitor, wherein a trench is formed in a semiconductor substrate and a capacitor is formed inside the trench. However, in highly integrated DRAM devices, e.g., 16 Mb devices, isolation of the capacitors of adjacent memory cells without interference is very difficult to achieve.

A fin-structured capacitor has been proposed to increase cell capacitance by means of expanding the effective area of a capacitor. The fin-structured capacitor is a type of stacked capacitor which includes a storage electrode consisting of multiple spaced conductive layers. The top, bottom and side surfaces of each conductive layer can be used as effective area of the capacitor, therefore this structure is very advantageous to high integration of DRAM devices.

A conventional method for manufacturing the above fin-structured capacitor is explained as follows with reference to FIGS. 1-5. See also the article entitled "3-Dimensional Stacked Capacitor Cell for 16M and 64M DRAMS" by T. Ema et al., IEDM '88, pp. 592-595.

FIG. 1 is a sectional view showing a transistor formed in the active region of a semiconductor substrate, whereon alternating layers of insulating and conductive materials are deposited.

A conventional LOCOS isolation method is performed on a semiconductor substrate 1 such that a non-active region composed of a field oxide film 2 can be distinguished from an active region. AMOS transistor is formed on the field oxide film 2 comprising a gate insulating film 3, a gate electrode 4, a source region 5 and a drain region 6 formed in the active region. A wordline 4-1 is formed on the field oxide film 2 by patterning simultaneously when the gate electrode 4 is patterned.

A nitride film 7 is then formed on the whole surface of the resultant structure as an etching blocking layer to insulate the gate electrode 4. Then, a first insulating layer 8a of, i.e., silicon oxide, a first conductive layer 9a of, i.e., polysilicon, and a second insulating layer 8b of, i.e., silicon oxide, are successively formed on the nitride film 7.

A fin structure is then formed. For example, a two-tiered silicon oxide layer and a single polysilicon layer are alternately formed into a two-fin structure. Likewise, three layers of silicon oxide and two layers of polysilicon therebetween form a three-fin structure.

A contact hole is formed on the source region 5 by applying a mask pattern. The contact hole connects the source region 5 and a storage electrode of the capacitor.

Thereafter, a second conductive layer 9b of, i.e., polysilicon is formed by depositing polysilicon on the whole surface of the semiconductor substrate including the contact hole, whereon the first and second silicon oxide layers 8a, 8b and a first polysilicon layer 9a have been sequentially formed.

FIG.3 is a sectional view showing the formation of the storage electrode pattern of the capacitor. An etching step is performed by applying a mask pattern which leaves selective portions of the first and second polysilicon layers 9a, 9b and the second oxide layer 8b within a predetermined range centering on the contact hole.

FIG. 4 is a sectional view showing a completed storage electrode of the conventional capacitor. The second oxide layer 8b (which remains between the first and second polysilicon layers 9a, 9b) and the first oxide layer 8a are removed by wet-etching, thereby completing the fin-structured storage electrode 9. The nitride film 7 works as an anti-etching layer to prevent the underlying transistor from being damaged by the etching process.

FIG. 5 is a sectional view showing a completed capacitor and a bit line. A dielectric film 13 is formed on the upper surface of the storage electrode 9. A polysilicon layer is then deposited on the whole resultant surface, and patterned to form a plate electrode 14. Thereafter, an insulating film 15 is formed to insulate the plate electrode 14 from the bit line 16. The bit line 16 is formed by depositing a conductive material on the whole resultant surface after a contact hole is formed over the drain region 6.

The conventional fin-structured capacitor as disclosed by T. Ema can improve the effective surface area of the capacitor assuring sufficient memory cell capacitance, but problems still exist with the conventional method of manufacture.

First, reactive ion etching is used as the etching process for forming the storage electrode pattern by alternately etching polysilicon and silicon oxide layers. This method is overly complicated and damages the surface of the storage electrode due to changes in the etching process conditions for each layer, resulting in a deterioration of the reliability of the memory cell capacitance.

Second, a stringer is apt to be generated in the peripheral circuit region of the memory cell when the silicon oxide layer and polysilicon layer are sequentially etched if the over-etch process for their removal is insufficient.

Third, since the conventional fin-structure forms a storage electrode which is vertically multi-layered, the resulting cell topography becomes very poor. In addition, a photolithography margin for forming the contact hole and the storage electrode pattern in the conventional fin-structured device is reduced.

SUMMARY OF THE INVENTION

It is an object of the present invention to provide a manufacturing method of a semiconductor device having a sufficient effective area of a capacitor with a decreased width in the buried contact, thereby providing an improved process margin for forming a contact hole, and enhancing the integration of the memory device.

It is another object of the present invention to provide a manufacturing method of a semiconductor device which forms a stable storage electrode by preventing damage to the surface of a storage electrode of a capacitor and preventing breakage of the storage electrode at its fin connections.

It is still another object of the present invention to provide a manufacturing method of a semiconductor device having an improved cell topology.

A first and/or a second material layer whose etching speed is greater than that a first conductive layer is formed on the first conductive layer. The first conductive layer operates as an etching block layer against the first and second material layers when a contact hole is formed to connect the storage electrode of a capacitor to the source region of a transistor. The first conductive layer therefore remains protruded toward the inside of a contact hole.

The width of the contact hole can be reduced even with the use of a conventional contact hole mask. Also, a mask having a larger exposing region can be used when the same-sized contact hole is formed.

Further, since the first and second material layers are comprised of a material capable of being wet-etched, the danger of stringer generation in the peripheral circuitry is eliminated without over-etching, and damage to the storage electrode is reduced.

BRIEF DESCRIPTION OF THE DRAWINGS

The above objects and other advantages of the present invention will become more apparent by the detailed description of the preferred embodiments thereof with reference to the attached drawings, in which.

DESCRIPTION OF THE PREFERRED EMBODIMENTS

The present invention will now be explained with reference to the following examples.

Embodiment 1

A first embodiment of the present invention will now be described with reference to FIG. 6 through FIG. 15.

Figure 1:
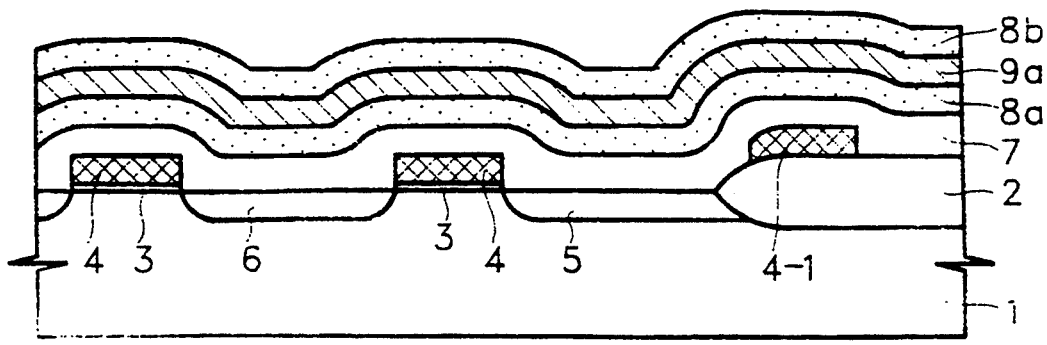
FIGS. 1 to 5 are sectional views showing a conventional method for manufacturing a DRAM cell having a fin-structured capacitor.
Figure 2:
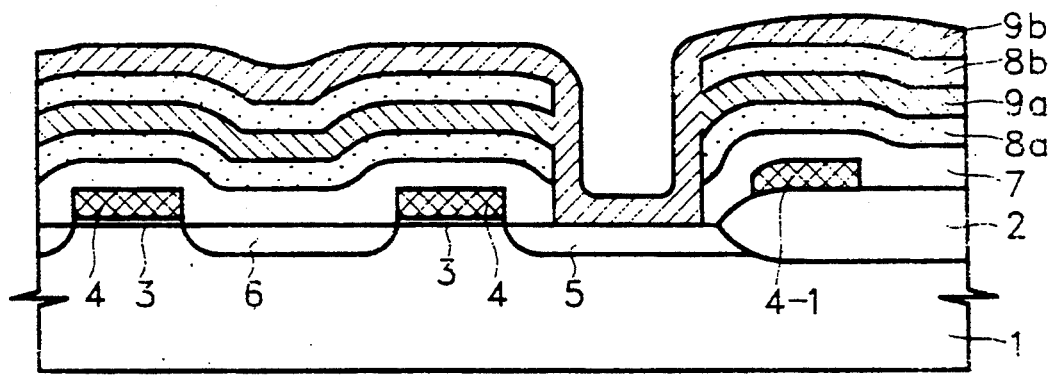
Figure 3:
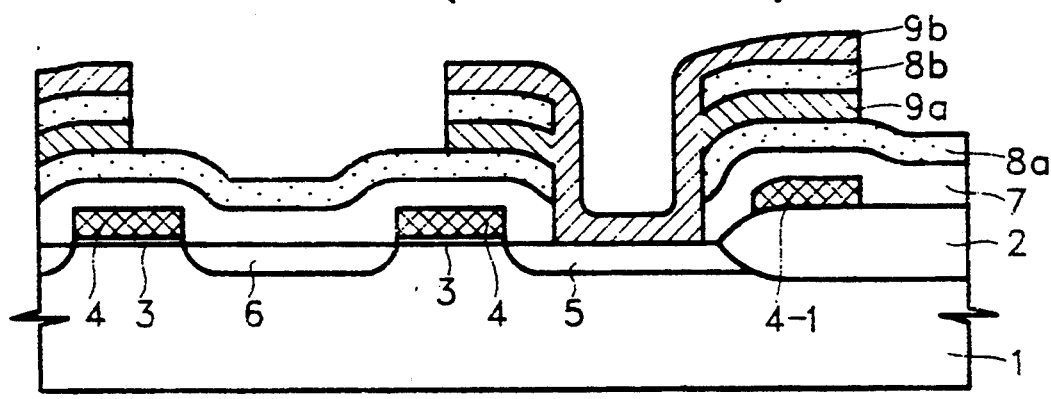
Figure 4:
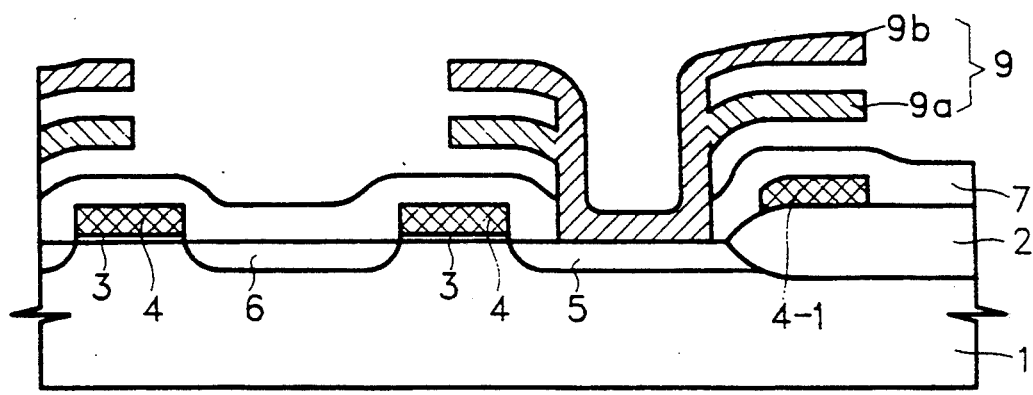
Figure 5:
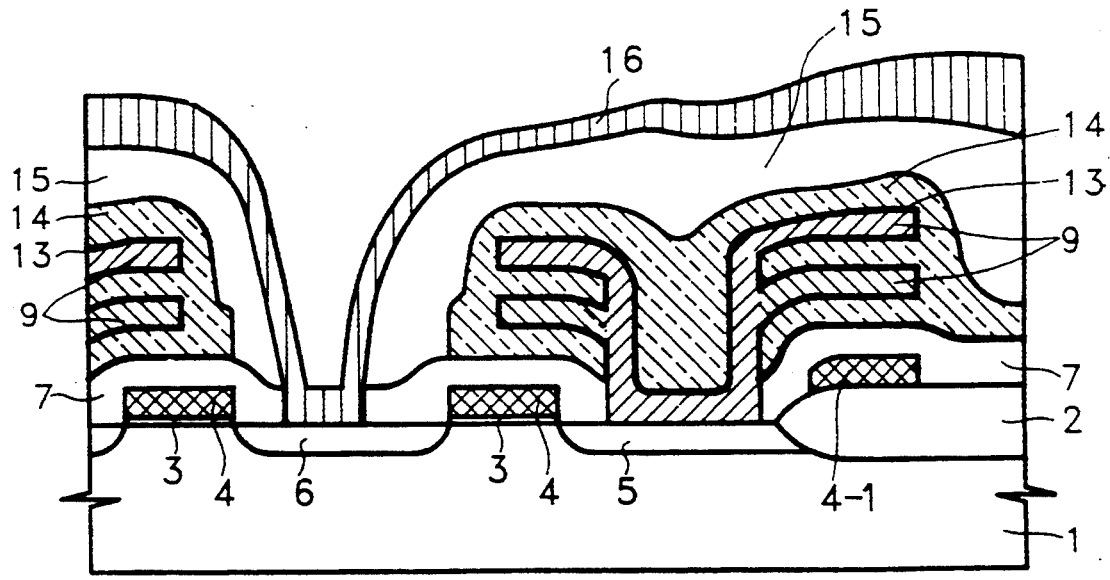
Figure 6:
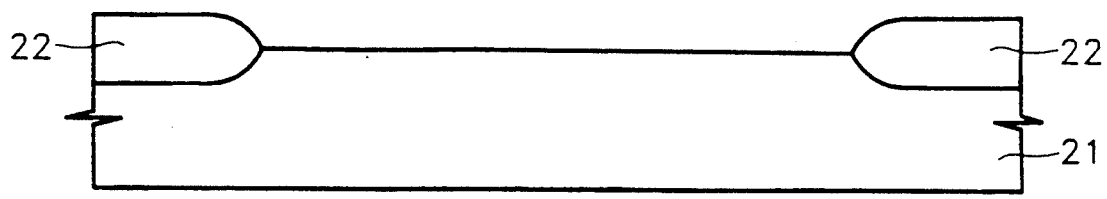
FIG. 6 to FIG. 15 are sectional views showing a method for manufacturing a DRAM cell according to a first embodiment of the present invention.

FIG. 6 shows a step of forming a field oxide film 22 on a semiconductor substrate 21. A non-active region, where a field oxide film 22 is formed on semiconductor substrate 21, and the element active region which is surrounded by the above field oxide film 22 are formed by a conventional isolation method such as a local oxidation of silicon (LOCOS).

Figure 7:
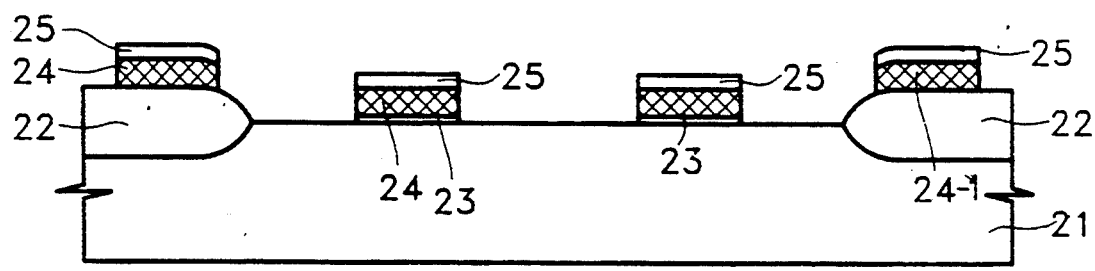

FIG. 7 shows the step of forming a gate electrode 24 on an active region of a semiconductor substrate 21 and a word-line 24-1 formed on a non-active region thereof. More particularly, a gate insulating film 23 is formed on a semiconductor substrate 21. Then a conductive layer (a gate electrode forming material layer) for forming the gate electrode 24 is formed. A high temperature oxide (HTO) for a first HTO film 25 is formed thereon. Then, the gate electrode 24 and the wordline 24-1 are formed in the active and non-active regions, respectively, by simultaneously patterning the conductive layer via a conventional photolithography process. At this time, a first HTO film 25 formed on the gate electrode 24 may be formed to a thickness of 1,000Å to approximately 3,000Å so as to prevent a short between the storage electrode and gate electrode 24 within a contact hole when etched for forming a buried contact hole on the source region. The preferred steps are described, however the forming step of the first HTO film 25 may be omitted as necessary.

Figure 8:
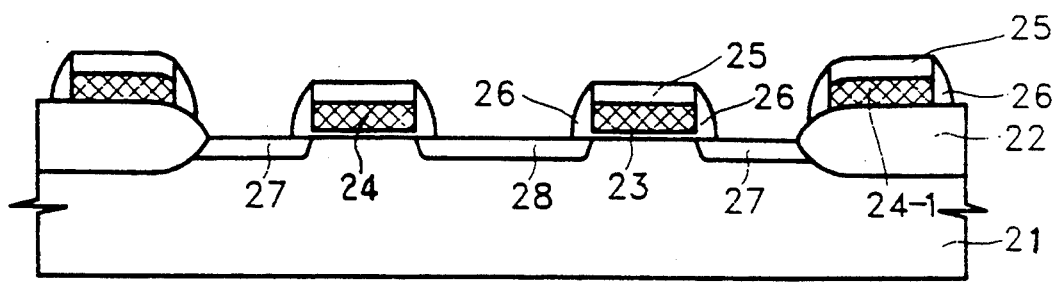

FIG. 8 shows a step of forming the source regions 27 and drain regions 28 of a transistor. The source regions 27 and drain regions 28 are formed by source/drain ion implantation, wherein ion implantation to the gate electrode does not occur because of a first HTO film 25 above the gate electrode 24, or the gate electrode 24 itself (when a first HTO film is not formed) blocks implantation into the substrate.

An HTO film is formed on the whole surface of the substrate, which is then etched. A second HTO spacer 26 is formed on the sidewalls of the gate electrode 24 and first HTO film 25 by, for example, anisotropic etching.

Figure 9:
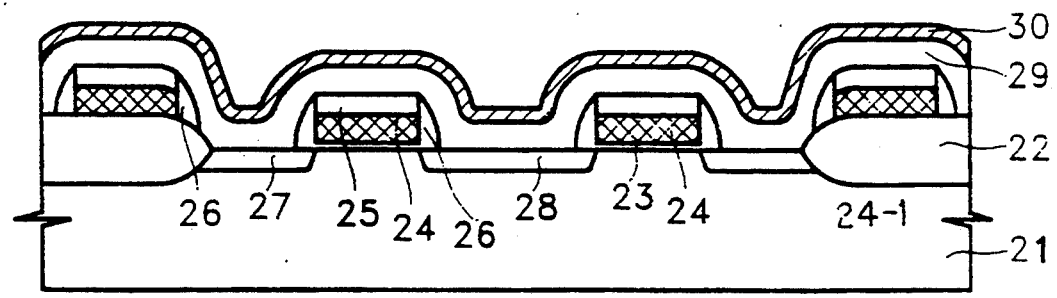

FIG. 9 shows a step of forming a third HTO film 29 over the entire resultant structure of the step of FIG. 8 for the insulation of the capacitor. A first conductive layer 30 of polysilicon forms a fin-shaped storage electrode of the capacitor. The first conductive layer 30 not only serves to enlarge the capacitor's effective area but also acts as an etch-block film when the etching process is performed for the formation of a buried contact. The first conductive layer 30 is formed thinly, (e.g., approximately 500Å to 3000Å) relative to the topography of the entire cell, the enlarging of the effective area and the contact hole size. It makes no difference if the first conductive layer 30 is formed by ion-implanting arsenic to a polysilicon, by doping impurities using a $POCl_3$ deposition, or by using an impurity-doped polysilicon.

Figure 10:
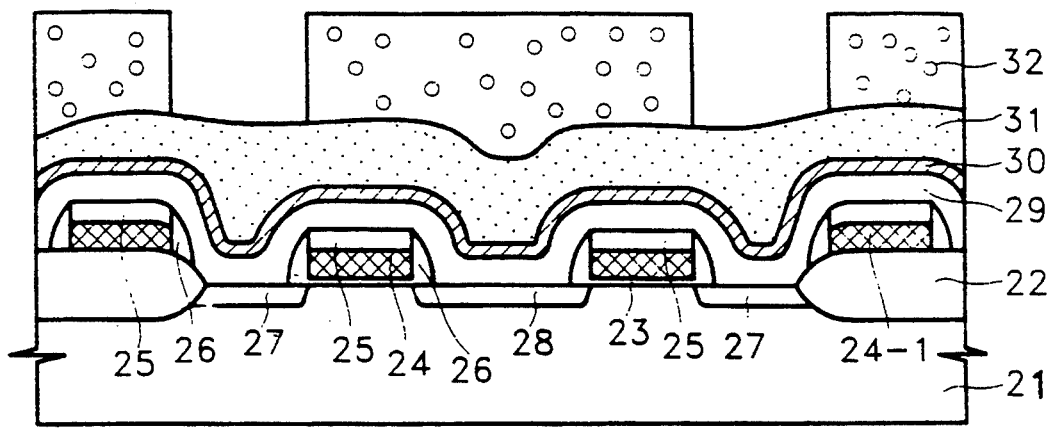

FIG. 10 shows a step of forming a photoresist pattern 32 for forming a contact hole after a planarized first material layer 31 is formed on the first conductive layer 30.

To form the planarized first material layer 31, a reflowable borophospho-silicate glass (BPSG) is deposited to a thickness of approximately 2,500Å to 4,000Å on top of the first conductive layer 30, and then reflowed to planarize its surface. At this time, the temperature of the reflow-processing should be kept below 850° C. so that the characteristics of the already formed transistors do not deteriorate. By planarizing the substrate using BPSG film 31 before the buried contact is formed, a sufficient process margin can be assured for the photolithography processes to form the buried contact and the successively formed storage electrode. A photoresist is then coated on the planarized BPSG film 31, and a photolithography process is performed by applying a buried contact mask to form a photoresist pattern 32. The buried contact mask has a larger exposure area than that of the conventional buried contact mask used for manufacturing an STC cell. Using the buried contact mask having a large exposure area enables the contact hole to be easily opened when the buried contact photolithography processing is performed. If the conventional buried contact mask is used as it is, the width of the contact hole is reduced as compared with the conventional process. A reduced width of the contact holes allows for a higher integration. Accordingly, the range of mask selection is enlarged.

Figure 11:
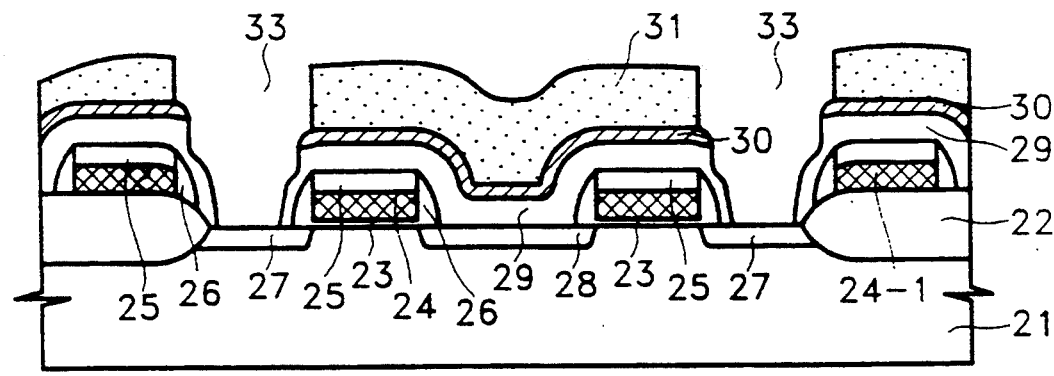

FIG. 11 shows a step of removing the photoresist pattern 32 after the buried contact hole 33 is formed. When the BPSG film 31 is exposed by photoresist pattern 32 and etched, the first conductive layer 30 acts as an etching block layer for the BPSG film 31, since the etching speed of the BPSG film 31 is greater than that of the first conductive layer 30. Then, the exposed first conductive layer 30 and the third HTO film 29 are removed sequentially. The photoresist pattern 32 used for the buried contact pattern is then removed, completing the formation of a buried contact hole 33.

After etching, the exposed edge of the first conductive layer 30 protrudes slightly beyond the BPSG film 31 and toward the center of the contact hole, due to the difference in the etching rates of the first conductive layer and the BPSG film. The protrusion of the first conductive layer 30 acts as an etching mask when the third HTO film 29 is etched. Accordingly, the lower width of the buried contact hole 33 is further narrowed, thereby preventing shorts between the succeeding conductive layer filled in the buried contact hole 33 and the gate electrode 24 or wordline 24-1.

Figure 12:
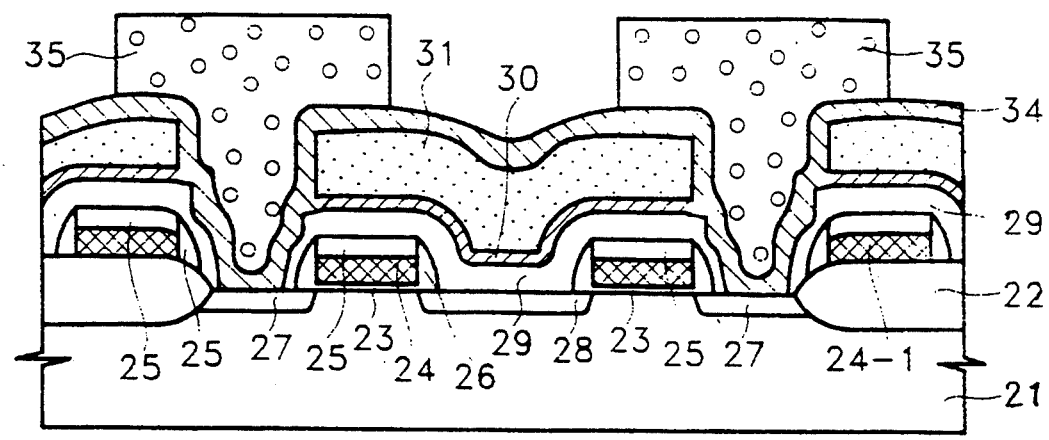

FIG. 12 shows a step of forming a second conductive layer 34 on the BPSG film 31 to form a storage electrode.

Polysilicon is deposited over the entire substrate, including the buried contact hole 33. Impurities are then doped using arsenic ion-implantation or $POCl_3$, to form a second conductive layer 34 for the storage electrode. The second conductive layer 34 is formed to a thickness of approximately 1,000Å to 3,000Å. The second conductive layer 34 of the preferred embodiment is formed of a doped polysilicon layer. The photoresist is then coated and patterned to form a photoresist 35 for the storage electrode. A conventional mask for forming the storage electrode of a STC memory cell can also be used.

Figure 13:
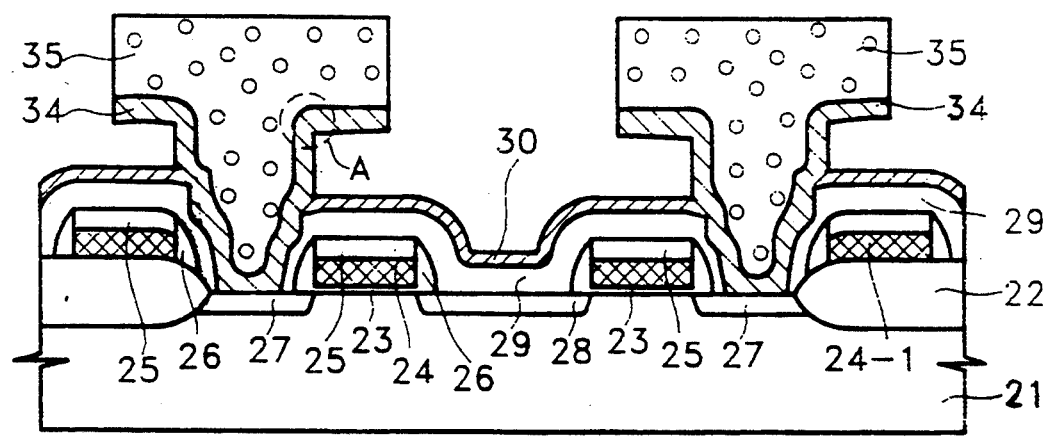

FIG. 13 shows a step of etching the second conductive layer 34 and the BPSG film 31 using the photoresist pattern 35 as an etching mask.

Initially, the second conductive layer 34 which is exposed by the photoresist pattern 35 is etched. Since the BPSG film 31 under the second conductive layer 34 is adequately thick, the second conductive layer 34 can be over-etched. Accordingly, the risk of generating stringers in the peripheral circuitry region is removed.

The remaining BPSG film 31 is wet etched using an HF or buffered oxide etchant (BOE) solution. The use of wet-etching instead of the conventional dry etching simplifies the manufacturing process and completely removes the BPSG film. The lower and side surfaces of the second conductive layer 34 exposed by the wet-etch process are used as the effective area of the storage electrode of the STC memory cell.

Figure 14:
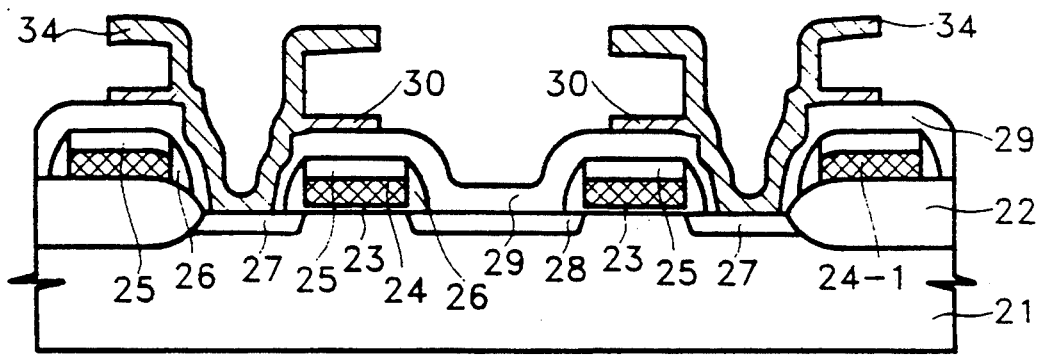

FIG. 14 shows a step of forming the storage electrode of a capacitor. The remaining photoresist pattern 35 is baked and hardened for a good adhesion of the photoresist. Then, a double fin-structured storage electrode consisting of the first and second conductive layers 30, 34 is formed by reactive-ion etching the first conductive layer 30 using a photoresist pattern 35 as an etching mask.

Figure 15:
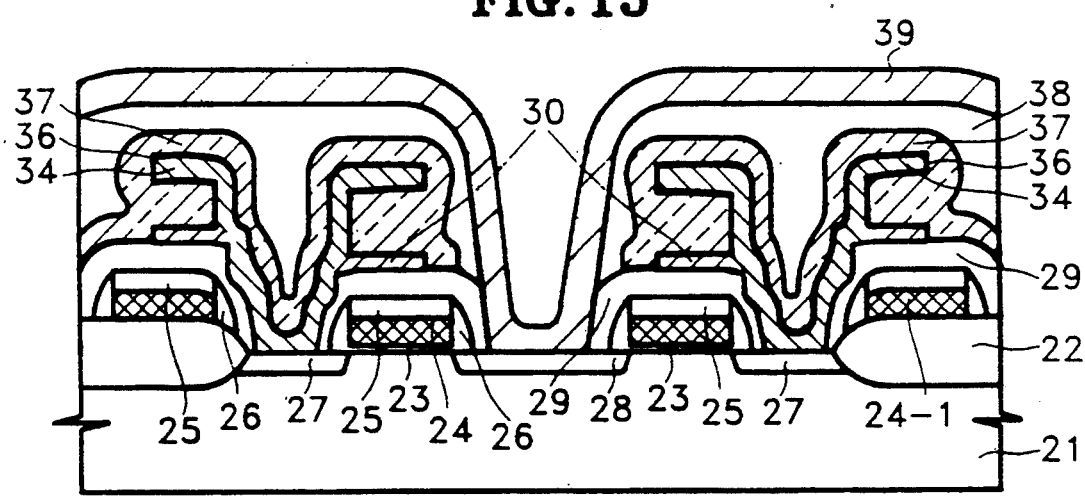

FIG. 15 shows a step of completing the capacitor and forming the bit-line 39. A dielectric film 36 of, for example, oxide/nitride/oxide (ONO) film is formed over the exposed surface of the storage electrode. A third conductive layer is formed over the whole surface of the resultant structure to form a plate electrode 37. An insulating film 38 is then formed for insulating the bit-line from the plate electrode 37. Then, a contact hole is formed on drain region 28. A fourth conductive layer is formed on the whole surface of the resultant structure to form a bit-line 39.

According, the difficulties in the conventional photolithography process caused by a severe step difference and the resulting problems with the process of forming the conventional fin-structured capacitor of T. Ema are solved by a planarization using the BPSG film. Also, the conventional complicated process wherein the processing condition is changed by alternating the conductive layer and insulating layer when the dry-etching process is performed to form a storage electrode is simplified by the wet-etching process disclosed in the present invention for removing the BPSG. Furthermore, this embodiment removes the concern over stringer generation.

Embodiment 2

FIGS. 16 to 21 show the manufacturing process of a semiconductor memory device according to a second embodiment of the present invention. The first portion of the manufacturing process is entirely the same as that disclosed with reference to FIGS. 6 to 9 as Embodiment 1, with identical reference numerals representing the same elements.

Figure 16:
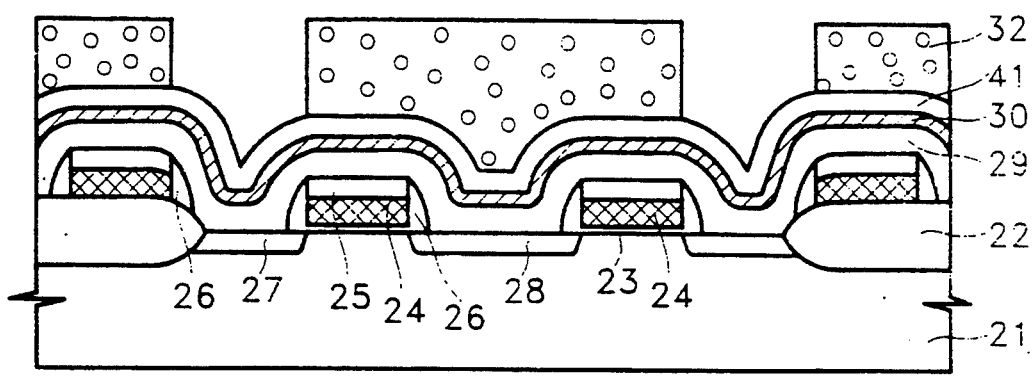
FIG. 16 to FIG. 21 are sectional views showing a method for manufacturing a DRAM cell according to a second embodiment of the present invention.

FIG. 16 shows a structure as in FIG. 9 and illustrates a step of forming a second material layer 41 on a first conductive layer 30, and forming a photoresist pattern 32 to form a contact hole following the step of FIG. 9.

A second material layer 41 is formed on the first conductive layer 30, and a photoresist layer is formed on the whole surface of the first conductive layer 30. Then, a photoresist pattern 32 is formed in order to form a buried contact hole. The second material layer 41 is comprised of a material having a greater etching rate than that of first conductive layer 30. The second material layer 41 is formed on the first conductive layer 30 to have a uniform thickness, being formed as thin as possible using IITO.

A photoresist pattern 32 is formed to form the buried contact on the source region 27. The photoresist pattern 32 is formed by use of a mask having an expanded exposure area larger than that of the buried contact mask of the conventional STC memory cell or that of the mask of the STC cell of Embodiment 1 of the present invention. Even if an expanded buried-contact mask is used, the first conductive layer 30 operates as an etching block film to narrow the width of the buried contact holes because a part of the first conductive layer 30 protrudes toward the inside of the buried contact hole. This enables the buried contact hole to be formed satisfactorily small, and assures a sufficient process margin. The width of the above buried contact hole can be controlled in accordance with the protruding remainder of the first conductive layer, by controlling the thickness of the first conductive layer 30 and etching time.

Figure 17:
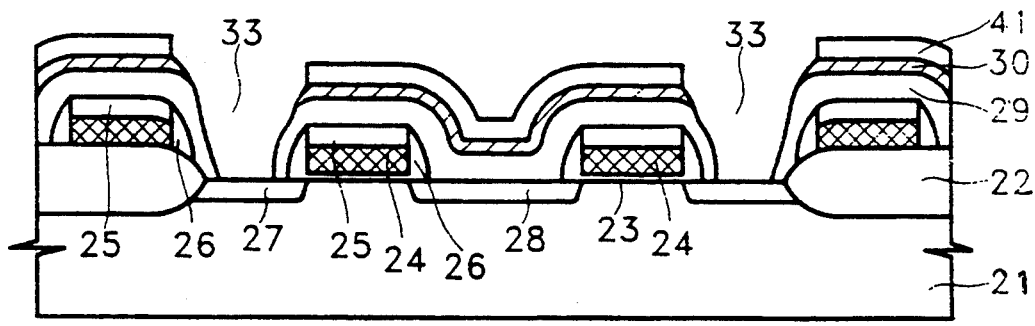

Referring to FIG. 17, a buried contact hole 33 is formed to expose the source region 27. The exposed second material layer 41 is etched using the photoresist pattern 32 of FIG. 16 as an etching mask. A polymeric material is generated around the HTO film 41 the HTO film is etched, and the amount of generated polymeric material can be controlled depending on the etching time. This polymeric material also operates as an etching block film, which gives the advantage of a reduced width of the buried contact hole.

The first material layer 30 below the second material layer 41 is not significantly etched during the buried contact etching. In addition, the second material layer 41 is very thin, for example 1,000Å or less, as compared with the BPSG film, i.e., the first material layer 31 shown in Embodiment 1.

In contrast, as shown in the step of FIG. 10, the BPSG film 31 of Embodiment 1 is planarized with a thick layer formed on the source region 27 wherein the buried contact is to be formed. Therefore, the BPSG film 31 in a buried contact hole 33 has to be completely removed during the etching process for forming a buried contact hole 33, which requires an over-etching. Accordingly, the first conductive layer 30 below the BPSG film 31 is attacked. Thus, the HTO films 29, 26 and 25 below the first conductive layer are also attacked when the first conductive layer is etched. Further, the semiconductor substrate 21 below the HTO film 29 within the buried contact hole 33 may be damaged, and the gate electrode 24 may be attacked causing a short between the successive second conductive layer 34 and the gate electrode 24.

A buried contact hole 33 is then formed by etching a first conductive layer 30 and a third HTO film 29 below the first conductive layer 30. The buried contact hole 33 becomes narrower towards its bottom due to the operation of the polymer and the protruded first conductive layer 30, as shown in FIG. 11 of Embodiment 1. Accordingly, the spacing between the buried contact hole 33 and the gate electrode 24 is sufficiently assured, thereby preventing shorts and improving insulation characteristics.

Figure 18:
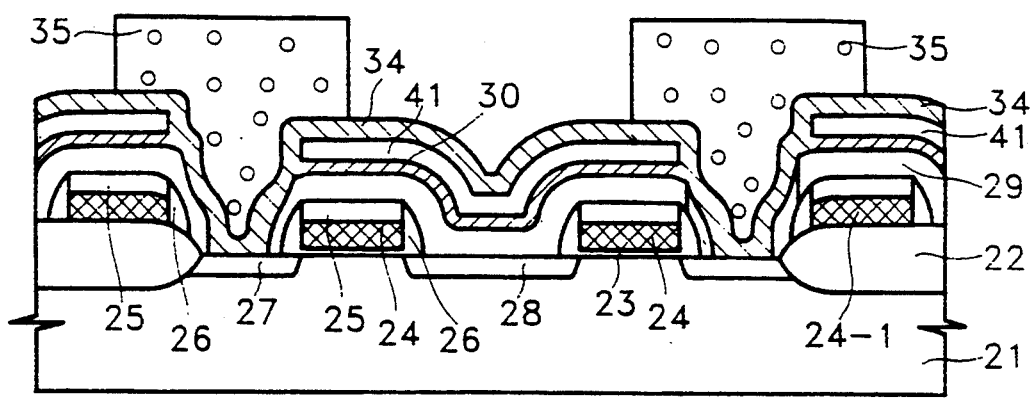

FIG. 18 shows a step of forming a second conductive layer 34 on the second material layer 41 having the contact hole 33 and a photoresist pattern 35 for the formation of the storage electrode of a capacitor in accordance with this second embodiment.

A second conductive layer 34 is formed on the whole surface of the resultant structure, including the contact hole 33, and a photoresist is coated thereon.

The second conductive layer 34 is formed by using, for example, the polysilicon material used for first conductive layer 30. It is preferable to form the second conductive layer 34 to be sufficiently thin, for example, 1,000Å or less. If the second conductive layer 34 is formed too thick, the buried contact hole 33 may be filled and thereby reduce the effective area of the storage electrode or generate a void in the lower part of the buried contact hole. Then, a photoresist pattern 35 is formed to form a storage electrode of a capacitor.

Figure 19:
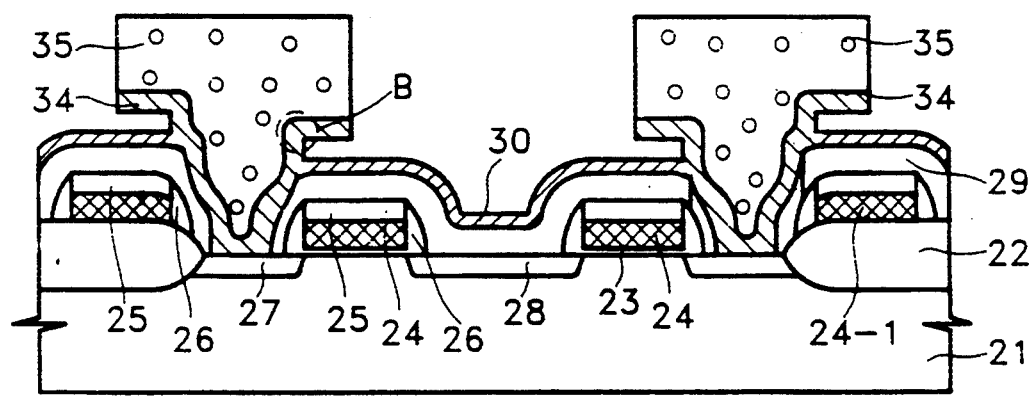

FIG. 19 shows a step of etching a part of the second conductive layer 34 using the photoresist pattern 35 as an etching mask, and removing the second material layer 41 below the second conductive layer 34.

Only the second conductive layer 34 is dry-etched using the photoresist pattern 35 of FIG. 18 as an etching mask, then all of the exposed second material layer 41 is removed by a wet-etching. HF or a super buffered oxide etchant (SBOE) solution can be used as a chemical etchant. The etching rate of the HTO film as a second material layer 41 is very great as compared with that of the BPSG film of Embodiment 1. For example, when a BOE etching solution is used, the etching rate of the BPSG film is 800 to 900Å per minute while the etching rate of the HTO film is 1,800 to 2,000Å per minute, showing that the etching rate of the HTO film is about twice that of BPSG film.

Since the BPSG film 31 of Embodiment 1 is formed very thick to planarize its surface, the etching time becomes much longer. Therefore, the weak part "A" of a second conductive layer 34 as shown in FIG. 13 may be attacked during an etching process, which would normally cause a concern in that the weak part may be broken. In contrast, the second material layer 41 is formed very thin and has a very great etching rate in this second embodiment. Therefore, part "B" of FIG. 19, i.e., the weak part of the fin-structured storage electrode, is only slightly attacked, relieving the concern that the weak part may be broken.

Figure 20:
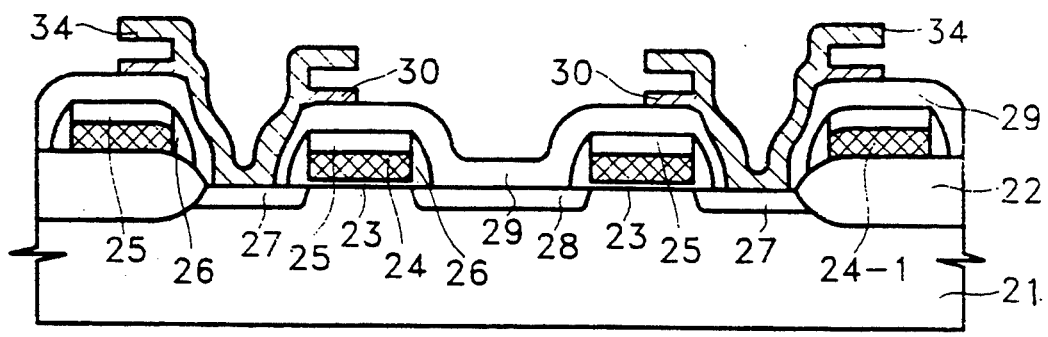

Referring to FIG. 20, the photoresist pattern 35 of FIG. 19 is baked and hardened to obtain good adhesion, and is then used as a mask for reactive-ion etching the exposed first conductive layer 30. Then, the storage electrode consisting of the first and second conductive layers 30, 34 is completed.

Figure 21:
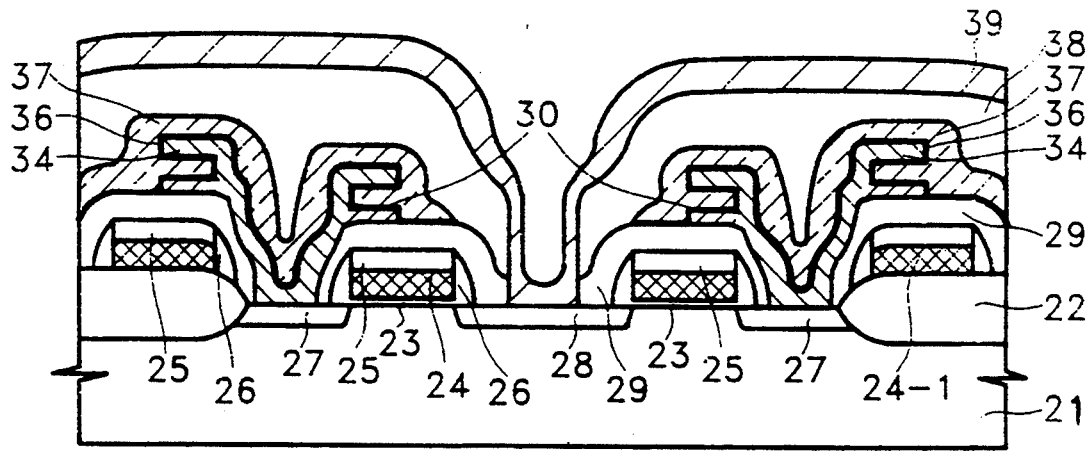

Referring to FIG. 21, an oxide/nitride/oxide (ONO) film is formed on the whole surface of the storage electrode as a dielectric film 36. A third conductive layer 37 for a plate electrode on the whole surface of the resultant structure. Then, an insulating film 38 for insulating the bit-line and plate electrode 37 are formed, and a contact hole is formed on the drain region 28. Thereafter, a fourth conductive layer is formed on the whole surface of the semiconductor substrate, and then bit line 39 is formed.

As can be seen from the second embodiment of the present invention, the formation of a thin HTO film 41 between a first and second conductive layer in manufacturing the double fin-structured capacitor according to the present invention can prevent a second conductive layer from damage caused by over-etching. In addition, the successive back-end processing can be performed smoothly due to the resulting good topography of the memory cells. Further, the characteristics of the formed transistor do not change because the reflow processing for planarizing the surface of the BPSG layer as in Embodiment 1 does not need to be performed at a high temperature. Also, the width of the buried contact hole can be adequately decreased with a sufficient process margin assured.

It should be understood that although the preferred embodiments of the present invention have been described in detail, many modifications and variations could be effected by one of ordinary skill in the art without departing from the spirit and scope lo of the invention as defined by the appended claims.

What is claimed is:

1. A method for manufacturing a storage capacitor electrode in a semiconductor memory device comprising the steps of:
    forming a source and a drain region of a transistor in a semiconductor substrate;
    forming a first material layer above said transistor;
    forming a first conductive layer above said first material layer;
    forming a second material layer above said first conductive layer, said second material layer having a different etch sensitivity than said first conductive layer;
    etching a contact hole through said second material layer, through said first conductive layer and through said first material layer to expose at least one of said source and drain region of said transistor, said etch step leaving a protrusion of said first conductive layer in said contact hole, said contact hole etching step controlling a difference between an upper contact hole width located over said first conductive layer and a lower contact hole width located under said first conductive layer, said difference being controlled in accordance with a thickness of said first conductive layer and an etching time of said first conductive layer;
    forming a second conductive layer on said first material layer and on exposed surfaces within said contact hole; and
    processing said second conductive layer to complete a storage capacitor electrode.

2. A method according to claim 1, wherein said step of forming said first material layer comprises a step of forming a high temperature oxide film.

3. A method according to claim 1, wherein said step of forming said second material layer comprises a step of forming a high temperature oxide film to a thickness of approximately 1,000Å or less.

4. A method according to claim 1, wherein said step of forming said first conductive layer comprises a step of forming a polysilicon material to a thickness of about 500Å to about 3000Å.

5. A method according to claim 1, wherein said step of forming said second material layer comprises a step of forming a borophospho-silicate glass to a thickness of less than about 2500Å.

6. A method according to claim 1, wherein said step of processing said second conductive layer comprises steps of:
    etching a portion of said second conductive layer to expose a portion of said second material layer at a location away from said contact hole;
    etching portions of said second material layer to expose a portion of said first conductive layer at a location away from said contact hole; and
    etching a portion of said first conductive layer.

7. A method according to claim 6 wherein said step of etching portions of said second material layer comprises a step of wet-etching using a solution chosen from a group consisting of an HF solution and a buffered oxide etchant solution.

8. A method according to claim 1, wherein said step of processing said second conductive layer comprises steps of:
    applying a patterned layer of photoresist material above said second conductive layer;
    etching a portion of said second conductive layer using said photoresist as a mask to expose a portion of said second material layer at a location away from said contact hole;
    baking said photoresist material; and
    etching portions of said second material layer and first conductive layer.

9. A method for manufacturing an electrode for a storage capacitor in a semiconductor memory device comprising the steps of:
    forming a source and a drain region of a transistor in a semiconductor substrate;
    forming a first material layer above said transistor;
    forming a first conductive layer above said first material layer;
    forming a second material layer above said first conductive layer;
    forming a contact hole through said second material layer, through said first conductive layer and through said first material layer to expose at least one of said source and drain region of said transistor, said etch step leaving a protrusion of said first conductive layer in said contact hole, said contact hole formation step controlling a difference between an upper contact hole width located over said first conductive layer and a lower contact hole width located under said first conductive layer, said difference being controlled in accordance with a thickness of said first conductive layer and an etching time of said first conductive layer;
    forming a second conductive layer on said second material layer and on exposed surfaces within said contact hole;
    processing said second conductive layer to complete a first storage capacitor electrode.

10. A method according to claim 9, wherein said step of forming said second material layer comprises a step of forming a high temperature oxide film.

11. A method according to claim 9, wherein said step of forming said contact hole controls said difference in width by controlling a width of said contact hole by adjusting an amount of a polymeric material generated when said second material layer is etched.

12. A method according to claim 9, wherein said step of forming said contact hole includes a step of etching said second material layer by wet-etching using a solution chosen from a group consisting of an HF solution and a buffered oxide etchant solution.

13. A method according to claim 1, wherein said step of forming said second material layer comprises a step of forming a high temperature oxide to a thickness of less than about 1000Å.

14. A method for manufacturing a storage capacitor in a semiconductor memory device comprising the steps of:
forming a source and a drain region of a transistor in a semiconductor substrate;
forming a layer of high temperature oxide above said transistor;
forming a first conductive layer above said layer of high temperature oxide;
forming a layer of borophospho-silicate glass above said first conductive layer;
etching a contact hole through said layer of borophosphto-silicate glass, through said first conductive layer and through said layer of high temperature oxide to expose at least one of said source and drain region of said transistor, said etch step leaving a protrusion of said first conductive layer in said contact hole, said contact hole etching step controlling a difference between an upper contact hole width located over said first conductive layer and a lower contact hole width located under said first conductive layer, said difference being controlled in accordance with a thickness of said first conductive layer and etching time of said first conductive layer;
forming a second conductive layer on said layer of high temperature oxide and on exposed surfaces within said contact hole; and
processing said second conductive layer to complete a storage capacitor electrode;
forming a dielectric film above said storage capacitor electrode; and
forming a second electrode separated from said storage capacitor electrode by said dielectric film.

15. A method according to claim 14, wherein said step of processing said second conductive layer to complete said storage capacitor electrode comprises steps of:
etching a portion of said second conductive layer with a first etch process to expose a portion of said layer of borophospho-silicate glass at a location away from said contact hole;
etching portions of said layer of borophospho-silicate glass with a second etch process to expose a portion of said layer of high temperature oxide at a location away from said contact hole; and
etching a portion of said first conductive layer with a third etch process.

* * * * *